US012757659B2

(12) United States Patent
Sherpa et al.

(10) Patent No.: US 12,757,659 B2
(45) Date of Patent: Oct. 6, 2026

(54) METHODS FOR REDUCING PHOTORESIST AND CARBON ETCH RATES IN AN ICP PROCESS CHAMBER USING A SILICON-BASED CHAMBER PRE-COAT

(71) Applicant: Applied Materials, Inc., Santa Clara, CA (US)

(72) Inventors: Sonam Dorje Sherpa, Santa Clara, CA (US); Alok Ranjan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 230 days.

(21) Appl. No.: 18/542,434

(22) Filed: Dec. 15, 2023

(65) Prior Publication Data

US 2025/0201573 A1 Jun. 19, 2025

(51) Int. Cl.

*H10P 50/28* (2026.01)
*H01J 37/32* (2006.01)
*H10P 50/00* (2026.01)

(52) U.S. Cl.

CPC .......... *H10P 50/283* (2026.01); *H01J 37/321* (2013.01); *H01J 37/32449* (2013.01); *H01J 37/32495* (2013.01); *H01J 37/32743* (2013.01); *H10P 50/73* (2026.01); *H01J 2237/332* (2013.01); *H01J 2237/334* (2013.01)

(58) Field of Classification Search

None
See application file for complete search history.

(56) References Cited

U.S. PATENT DOCUMENTS

| | | | | |
|---|---|---|---|---|
| 9,355,823 | B2 * | 5/2016 | Lin | H01J 37/32477 |
| 10,658,161 | B2 * | 5/2020 | Wang | H01J 37/3244 |
| 10,679,830 | B2 * | 6/2020 | Bi | H01J 37/32568 |
| 2010/0267224 | A1 | 10/2010 | Choi et al. | |
| 2018/0226235 | A1 | 8/2018 | Lin et al. | |
| 2019/0295826 | A1 | 9/2019 | Wang et al. | |
| 2021/0340670 | A1 | 11/2021 | Singhal et al. | |
| 2022/0093367 | A1 * | 3/2022 | Tanaka | H01J 37/32449 |
| 2024/0249921 | A1 * | 7/2024 | Park | H01J 37/32807 |

OTHER PUBLICATIONS

International Search Report and Written Opinion for PCT/US2024/055381 dated Feb. 24, 2025.

* cited by examiner

*Primary Examiner* — Shamim Ahmed
(74) *Attorney, Agent, or Firm* — Patterson + Sheridan, LLP

(57) ABSTRACT

The present disclosure relates to a method for reducing photoresist and carbon etch rates in a process chamber using a silicon-based chamber pre-coat. The method includes forming, in-situ the process chamber, a coating layer on a surface of a lid assembly of the process chamber, the coating layer comprising a silicon-containing material, and etching a target layer disposed on a substrate through a mask layer having a carbon-containing material, while the substrate is disposed on an electrostatic chuck below the coating layer of the lid assembly.

19 Claims, 7 Drawing Sheets

405A
486
484
487A 405B
486
484
487B 405C
486
484
487C

METHODS FOR REDUCING PHOTORESIST AND CARBON ETCH RATES IN AN ICP PROCESS CHAMBER USING A SILICON-BASED CHAMBER PRE-COAT

BACKGROUND

Field

Examples of the present disclosure generally relate to plasma processing of a semiconductor substrate, and more particularly, to methods for reducing photoresist and carbon etch rates in an inductively coupled plasma (ICP) chamber using a silicon-based chamber pre-coat.

Description of the Related Art

In nanoscale electronic device fabrication, controlling the etch rates of photoresist and mask layers is important during a high aspect ratio etching process designed to form narrow and deep patterns (e.g., openings, trenches, mesa structures, etc.) in the underlying layers of a semiconductor substrate. When the etching process is performed using an ICP system, a lid assembly of the ICP process chamber often includes an oxide material. During etching, the oxide material in the lid assembly releases oxygen into a plasma-excited process gas in the process chamber. The addition of oxygen in the plasma-excited process gas changes the plasma characteristics and results in increased etch rates of photoresist and mask layers on the substrate. The increased photoresist and carbon etch rates can affect the etch results of the underlying layers, and have a significant impact on the quality and performance of nanoscale electronic devices thereon.

Therefore, there is a need in the art for methods to reduce photoresist and carbon etch rates during high aspect ratio etches in an ICP process chamber.

SUMMARY

The present disclosure provides methods for reducing photoresist and carbon etch rates during a high aspect ratio etch on a substrate disposed in an ICP process chamber.

In one aspect, a method for etching a target layer disposed on a substrate through a mask layer having a carbon-containing material includes forming, in-situ a process chamber, a coating layer on a surface of a lid assembly of the process chamber, the coating layer comprising a silicon-containing material. The method further includes etching the target layer while the substrate is disposed on an electrostatic chuck below the coating layer of the lid assembly.

In another aspect, a method for processing a substrate includes forming, in-situ a plasma process chamber, a coating layer on a surface of a lid assembly of the plasma process chamber, the coating layer comprising a silicon-containing material. The method further includes transferring the substrate into the plasma process chamber, the substrate comprising a target layer and a mask layer over the target layer, the mask layer comprising a carbon-containing material. The method further includes etching the target layer below the coated lid assembly preferentially relative to the mask layer by using a plasma-excited process gas.

In another aspect, a processing system includes a process chamber, a gas panel coupled to the process chamber, and a controller for controlling the process chamber and the gas panel. The controller includes a processor and a non-transitory machine readable medium storing executable instructions that when executed by the processor cause the process chamber and the gas panel to perform operations including: forming, in-situ the process chamber, a coating layer on a surface of a lid assembly of the process chamber, the coating layer comprising a silicon-containing material; and etching a target layer disposed on a substrate through a mask layer having a carbon-containing material, while the substrate is disposed on an electrostatic chuck below the coating layer of the lid assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to methods for reducing photoresist and carbon etch rates during a high aspect ratio etch on a substrate disposed in an ICP process chamber.

Embodiments of the disclosure provide a silicon-containing coating layer on a lid assembly of an ICP process chamber before forming high aspect ratio features (e.g., openings, trenches, mesa structures, etc.) in one or more underlying layers of a substrate. The high aspect ratio etch may be performed using a plasma assisted etching process, such as a reactive ion etch (RIE) plasma process. The lid assembly may act as an upper electrode of the ICP process chamber. The lid assembly includes an oxygen-containing material, which, absent of a silicon-containing coating layer, would release oxygen into the plasma during the etching process and increase photoresist and carbon-based mask layer etch rates. The silicon-containing coating layer suppresses the release of oxygen from the lid assembly into the plasma, thereby reducing the etch rates of the photoresist and carbon-based mask layer. In addition, the silicon-containing coating layer releases silicon into the plasma during etching to form a silicon-loaded ICP process chamber. When a fluorine-containing etching chemistry is used to form the plasma, the silicon released from the coating layer creates a sink for the atomic fluorine in the plasma, which further reduces the photoresist and carbon-based mask layer etch rates. As such, a dielectric etch on the substrate disposed in the ICP process chamber can yield high aspect ratio features due to the better controlled photoresist and mask layer etch rates.

Figure 1A:
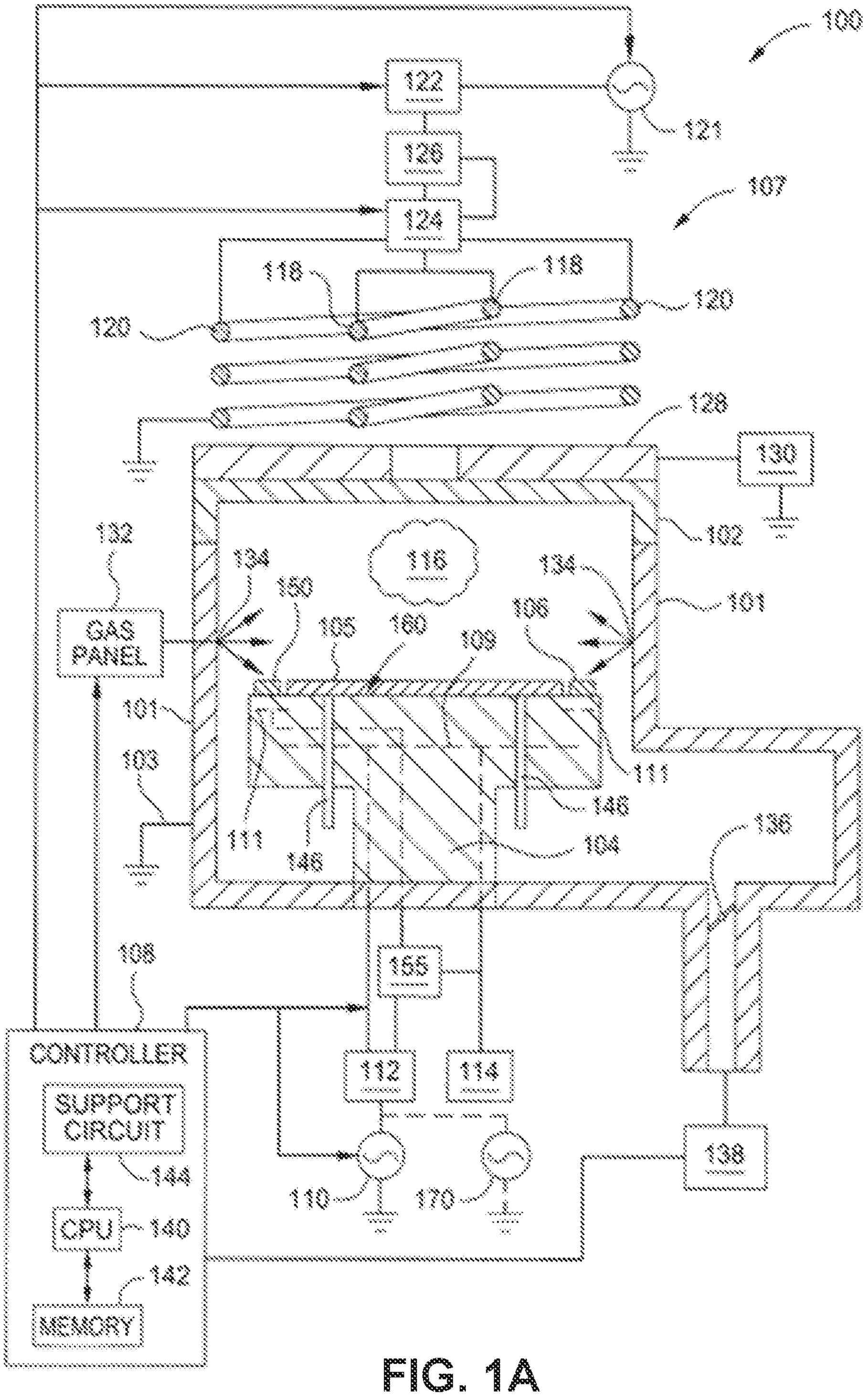
FIG. 1A is a schematic sectional view of a process chamber according to one embodiment of the disclosure.

FIG. 1A is a schematic sectional view of a process chamber 100, according to one embodiment of the disclosure. The process chamber 100 includes a chamber body 101 and a lid assembly 102 disposed thereon that together define an inner volume. The chamber body 101 is typically coupled to an electrical ground 103. The lid assembly 102 may act as an upper electrode for the process chamber 100. A substrate support assembly 104 is disposed within the inner volume to support a substrate 105 thereon during processing. An edge ring 106 is positioned around the periphery of the substrate 105 on the substrate support assembly 104. The process chamber 100 also includes an inductively coupled plasma apparatus 107 for generating a plasma of reactive species within the process chamber 100, and a controller 108 adapted to control systems and subsystems of the process chamber 100.

The substrate support assembly 104 includes one or more electrodes, such as a first electrode 109 and an optional second electrode, such as an edge ring electrode 111 are coupled to an RF power source 110 (at a first frequency and, in some embodiments, alternatively to a second RF power source 170 at a second frequency. The RF power source 110 through a matching network 112 and a tuning circuit 155 includes variable capacitors and inductors. The RF power source 110 is utilized to bias the substrate 105 disposed on an upper surface 160 of the substrate support assembly 104. The RF power source 110 may illustratively be a source of up to about 1,000 Watts (W) (but not limited to about 1,000 W) of RF energy, which may be provided by one or multiple frequencies, such as 13.56 MHz and 2 MHZ. In another embodiment, the RF power source 110 may be two separate power sources with different frequencies, e.g., 2 MHz and 13.56 MHz, which can be used separately or together. The RF power source 110 may be capable of producing either or both of continuous or pulsed power. The first electrode 109 is coupled to a chucking power source 114 to facilitate chucking of the substrate 105 to the upper surface 160 during processing. The RF power source 110 can be delivered to the substrate 105 either through coupling to a baseplate or connecting to the substrate electrode 109.

The substrate support assembly 104 may optionally include a chucking electrode when the substrate support assembly 104 includes an electrostatic chuck. The substrate support assembly 104 may optionally include a heater electrode (i.e., a resistive heater).

The inductively coupled plasma apparatus 107 is disposed above the lid assembly 102 and is configured to inductively couple RF power into the process chamber 100 to generate a plasma 116 within the process chamber 100. The inductively coupled plasma apparatus 107 includes first and second coils 118, 120, disposed above the lid assembly 102. The relative position, ratio of diameters of each coil 118, 120, and/or the number of turns in each coil 118, 120 can each be adjusted as desired to control the profile or density of the plasma 116 being formed. Each of the first and second coils 118, 120 is coupled to the RF power source 110 through a matching network 122 via an RF feed structure 124. The RF power source 110 may illustratively be capable of producing up to about 4000 W (but not limited to about 4000 W) at a tunable frequency in a range from 50 KHz to 13.56 MHz, although other frequencies and powers may be utilized as desired for particular applications.

In some examples, a power divider 126, such as a dividing capacitor, may be provided between the RF feed structure 124 and the RF power supply 121 to control the relative quantity of RF power provided to the respective first and second coils 118, 120. In some examples, the power divider 126 may be incorporated into the matching network 122.

A heater element 128 may be disposed on the lid assembly 102 to facilitate heating the interior of the process chamber 100. The heater element 128 may be disposed between the lid assembly 102 and the first and second coils 118, 120. In some examples, the heater element 128 may include a resistive heating element and may be coupled to a power supply 130, such as an AC power supply, configured to provide sufficient energy to control the temperature of the heater element 128 within a desired range.

During operation, the substrate 105, such as a semiconductor wafer or other substrate suitable for plasma processing, is placed on the substrate support assembly 104. Substrate lift pins 146 are movably disposed in the substrate support assembly 104 to assist in transfer of the substrate 105 onto the substrate support assembly 104. After positioning of the substrate 105, process gases are supplied from a gas panel 132 through entry ports 134 into the inner volume of the chamber body 101. The process gases are ignited into a plasma 116 in the process chamber 100 by applying power from the RF power supply 121 to the first and second coils 118, 120. In some examples, power from the RF power source 110, such as an RF or a pulsed DC source, may also be provided through the matching network 112 to electrodes 109 within the substrate support assembly 104. The pressure within the interior of the process chamber 100 may be controlled using a trottle valve 136 and a vacuum pump 138. The temperature of the chamber body 101 may be controlled using fluid-containing conduits (not shown) that run through the chamber body 101.

The process chamber 100 includes the controller 108 to control the operation of the process chamber 100 during processing. The controller 108 comprises a central processing unit (CPU) 140, a memory 142, and support circuits 144 for the CPU 140 and facilitates control of the components of the process chamber 100. The controller 108 may be one of any form of general-purpose computer processor that can be used in an industrial setting for controlling various chambers and sub-processors. The memory 142 stores software (source or object code) that may be executed or invoked to control the operation of the process chamber 100 in the manner described herein.

Figure 1B:
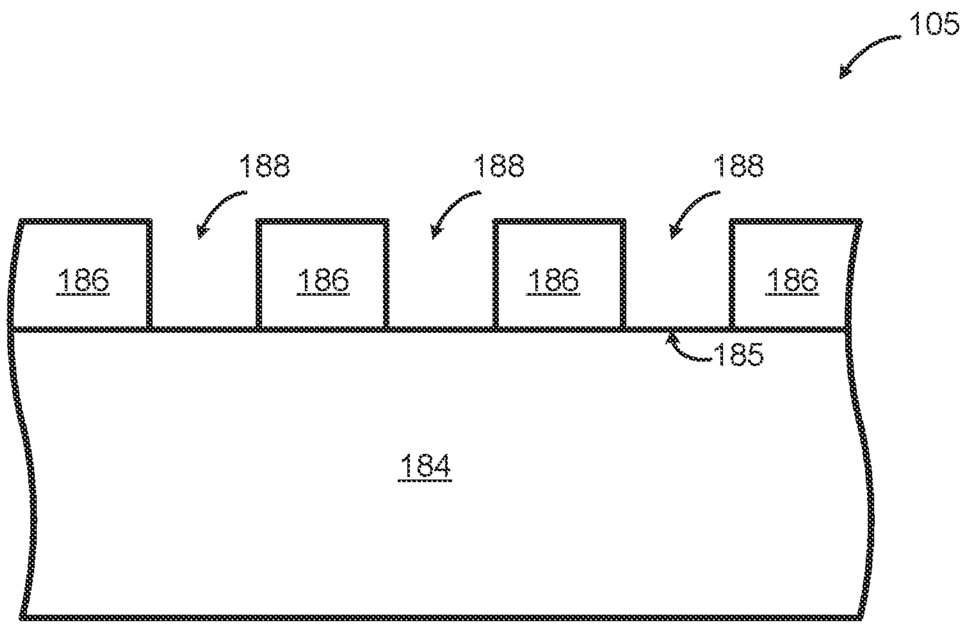
FIG. 1B illustrates a schematic cross-sectional view of a portion of the substrate shown in FIG. 1A according to one embodiment of the disclosure.

FIG. 1B illustrates a schematic cross-sectional view of a portion of the substrate 105 shown in FIG. 1A according to one embodiment of the disclosure. As illustrated in FIG. 1B, the substrate 105 includes a patterned mask layer 186 disposed on a target layer 184.

The target layer 184 may include a stack of layers underlying the mask layer 186. In some embodiments, the target layer 184 may include one or more insulating layers, one or more conductive layers, one or more semiconductor layers, or any combination thereof to manufacture one or more microelectronic devices. In some embodiments, the target layer 184 is an insulating layer. In some embodiments, a top portion of the target layer 184, in which openings (or trenches) are etched, includes a silicon-containing material. In an example, the target layer 184 includes an oxide layer, e.g., silicon oxide, aluminum oxide ("$Al_2O_3$"), silicon oxide nitride ("SiON"), a nitride layer, e.g., silicon nitride, other electrically insulating layer, or any combination thereof. In another example, the target layer 184 comprises a nitride layer (e.g., silicon nitride), or other nitride layer. In yet another example, the target layer 184 includes polysilicon, an amorphous silicon, metal, or any combination thereof.

In one embodiment, the target layer 184 may include a dielectric material. In some embodiments, the dielectric material may include, but not limited to, undoped silicon oxide (e.g., silicon dioxide ($SiO_2$)), silicon doped silicon oxide (e.g., fluorinated silicon oxide (FSG)), spin-on-glass (SOG), silicon nitride ($Si_3N_4$), silicate glasses (e.g., boron phosphate silicate glass (BPSG) and phosphate silicate glass (PSG)), doped or undoped thermally grown silicon oxide, doped or undoped TEOS deposited silicon oxide, and the like. In some embodiments, dopants for dielectric materials may include, but are not limited to, boron, phosphorus, arsenic, and the like.

In one embodiment, the target layer 184 is a stack of dielectric layers, for example, an oxide, a nitride, or any combination thereof. In one embodiment, the target layer 184 is a silicon nitride layer. In one embodiment, the target layer 184 is a silicon oxide layer. In yet another embodiment, the target layer 184 comprises a silicon oxide layer on a silicon nitride layer. In yet another embodiment, the target layer 184 comprises a silicon nitride layer on a silicon oxide layer. In yet another embodiment, the target layer 184 comprises a stack of oxide and nitride layers deposited on top of each other.

In one embodiment, the target layer 184 may include a semiconductor material—e.g., monocrystalline silicon ("Si"), polycrystalline Si, amorphous Si, germanium ("Ge"), silicon germanium ("SiGe"), a III-V materials based material (e.g., gallium arsenide ("GaAs")), or any combination thereof. In an embodiment, the target layer 184 includes a metal, for example, copper (Cu), aluminum (Al), indium (In), tin (Sn), lead (Pb), silver (Ag), antimony (Sb), bismuth (Bi), zinc (Zn), cadmium (Cd), gold (Au), ruthenium (Ru), nickel (Ni), cobalt (Co), chromium (Cr), iron (Fe), manganese (Mn), titanium (Ti), hafnium (Hf), tantalum (Ta), tungsten (W), vanadium (V), molybdenum (Mo), palladium (Pd), gold (Au), platinum (Pt), polysilicon, other conductive layer known to one of ordinary skill in the art of electronic device manufacturing, or any combination thereof.

In one embodiment, the target layer 184 may be part of metallization interconnect layers for integrated circuits. In one embodiment, the target layer 184 may be part of electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other suitable insulating layer. In at least some embodiments, the target layer 184 includes interconnects, for example, vias, configured to connect the metallization layers.

The target layer 184 can be formed using one or more deposition techniques, such as but not limited to a chemical vapour deposition ("CVD"), e.g., a Plasma Enhanced Chemical Vapour Deposition ("PECVD"), a physical vapour deposition ("PVD"), molecular beam epitaxy ("MBE"), metalorganic chemical vapor deposition ("MOCVD"), atomic layer deposition ("ALD"), or other suitable deposition techniques.

As illustrated in FIG. 1B, the mask layer 186 is formed over the target layer 184, and patterned to include one or more openings 188 therein. The openings 188 extend to a top surface 185 of the target layer 184.

In one embodiment, the mask layer 186 may include multiple mask layers. In one embodiment, the mask layer 186 includes a hard mask layer having a carbon-containing material, such as an amorphous carbon hard mask layer. The mask layer 186 may be covered by a photoresist. Alternatively, the mask layer 186 may only be comprised of a patterned photoresist layer. In one embodiment, the mask layer 186 includes one or more of boron, carbon and hydrogen. For example, the mask layer 186 includes from about 30% to about 70% by weight of boron, from about 25% to about 50% of carbon and from about 5% to about 40% of hydrogen. In one embodiment, the mask layer 186 is a boron doped amorphous carbon layer. In one embodiment, the mask layer 186 includes one or more of Advanced Patterning Film (APF) carbon hard masks produced by Applied Materials, Inc., located in Santa Clara, Calif. Generally, the purpose of the hard mask layer is to protect specific regions of the one or more layers covered by the hard mask from etching.

The mask layer 186 can be deposited onto the target layer 184 using one or more deposition techniques, such as but not limited to spin-on deposition, a chemical vapor deposition ("CVD"), a plasma enhanced chemical vapor deposition ("PECVD"), a physical vapor deposition ("PVD"), molecular beam epitaxy ("MBE"), metalorganic chemical vapor deposition ("MOCVD"), atomic layer deposition ("ALD"), or other suitable deposition technique.

In at least some embodiments, a photoresist layer (not explicitly shown in FIG. 1B) is deposited and patterned on the mask layer 186 using suitable photoresist deposition and patterning techniques. In at least some embodiments, the mask layer 186 is etched through the patterned photoresist using one or more suitable process gases (e.g., a fluorine-containing gas) to form the openings 188.

In one embodiment, the substrate 105 may include a semiconductor-on-isolator (SOI) substrate including a bulk lower substrate, a middle insulation layer, and a top monocrystalline layer. The top monocrystalline layer may comprise any material listed above (e.g., silicon). In an embodiment, the substrate 105 includes an insulating layer—e.g., an oxide layer, such as silicon oxide, aluminum oxide, silicon oxide nitride, a silicon nitride layer, any combination thereof, or other electrically insulating layer determined by an electronic device design. In one embodiment, the insulating layer of the substrate 105 includes an interlayer dielectric (ILD)—e.g., silicon dioxide. In one embodiment, the insulating layer of the substrate 105 includes polyimide, epoxy, photodefinable materials, such as benzocyclobutene (BCB), and WPR-series materials, or spin-on-glass. In an embodiment, the insulating layer of the substrate is an insulating layer suitable to insulate adjacent devices and prevent leakage.

In one embodiment, the lid assembly 102 in FIG. 1A includes an oxide material that releases oxygen into the ICP process chamber during a plasma assisted high aspect ratio etching process. The release of oxygen from the lid assembly 102 into the ICP process chamber can change the plasma characteristics and result in increased etch rates of photoresist and carbon-based mask layers on the substrate 105. In one embodiment, the software of the memory 142 comprises the instructions that when executed by the CPU 140 cause the process chamber 100 and gas panel 132 to form, in-situ the process chamber 100, a coating layer containing a silicon-based material on an interior surface of the lid assembly 102. During a plasma assisted etching process, such as an RIE plasma process, the coating layer substantially suppresses the release of oxygen from the lid assembly 102 and creates a sink for fluorine in the plasma-excited process gas in order to reduce the etch rates of photoresist and carbon-based mask layers on the substrate 105.

Figure 2:
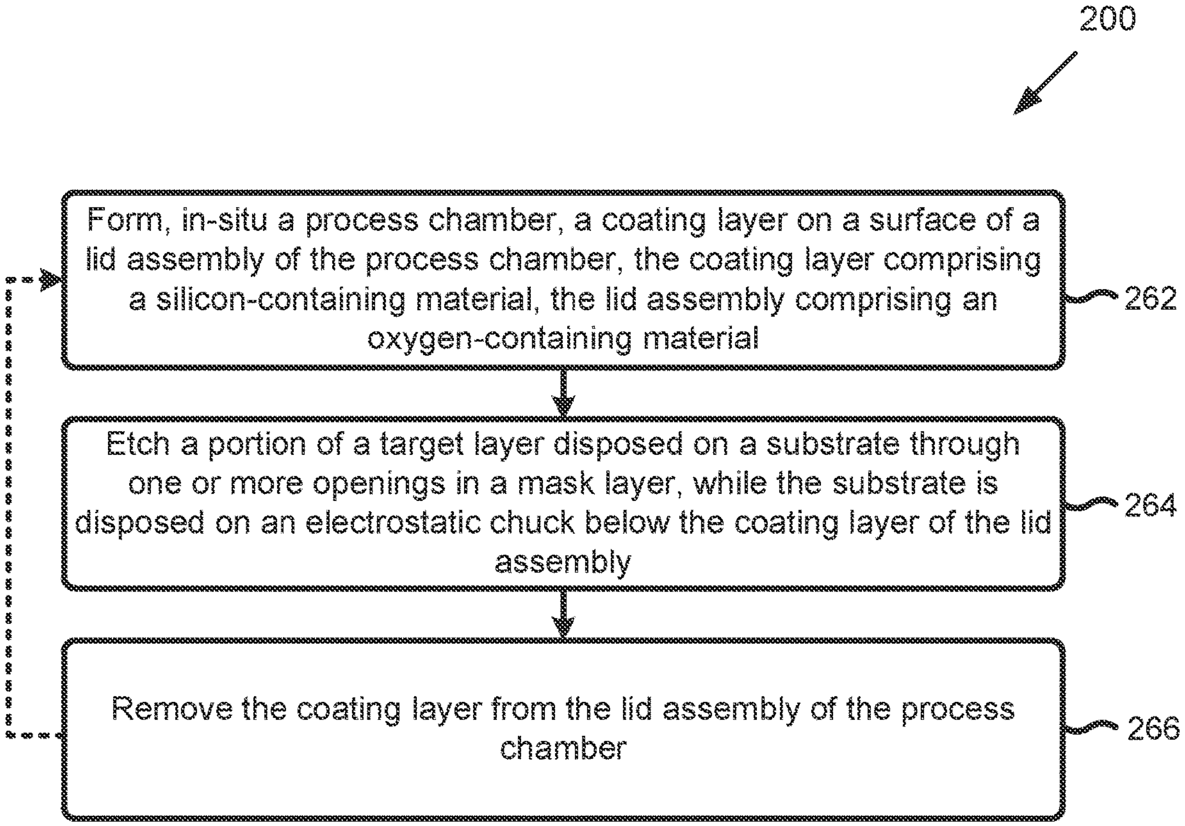
FIG. 2 illustrates a flowchart of a method for processing a substrate according to one embodiment of the disclosure.
Figure 3A:
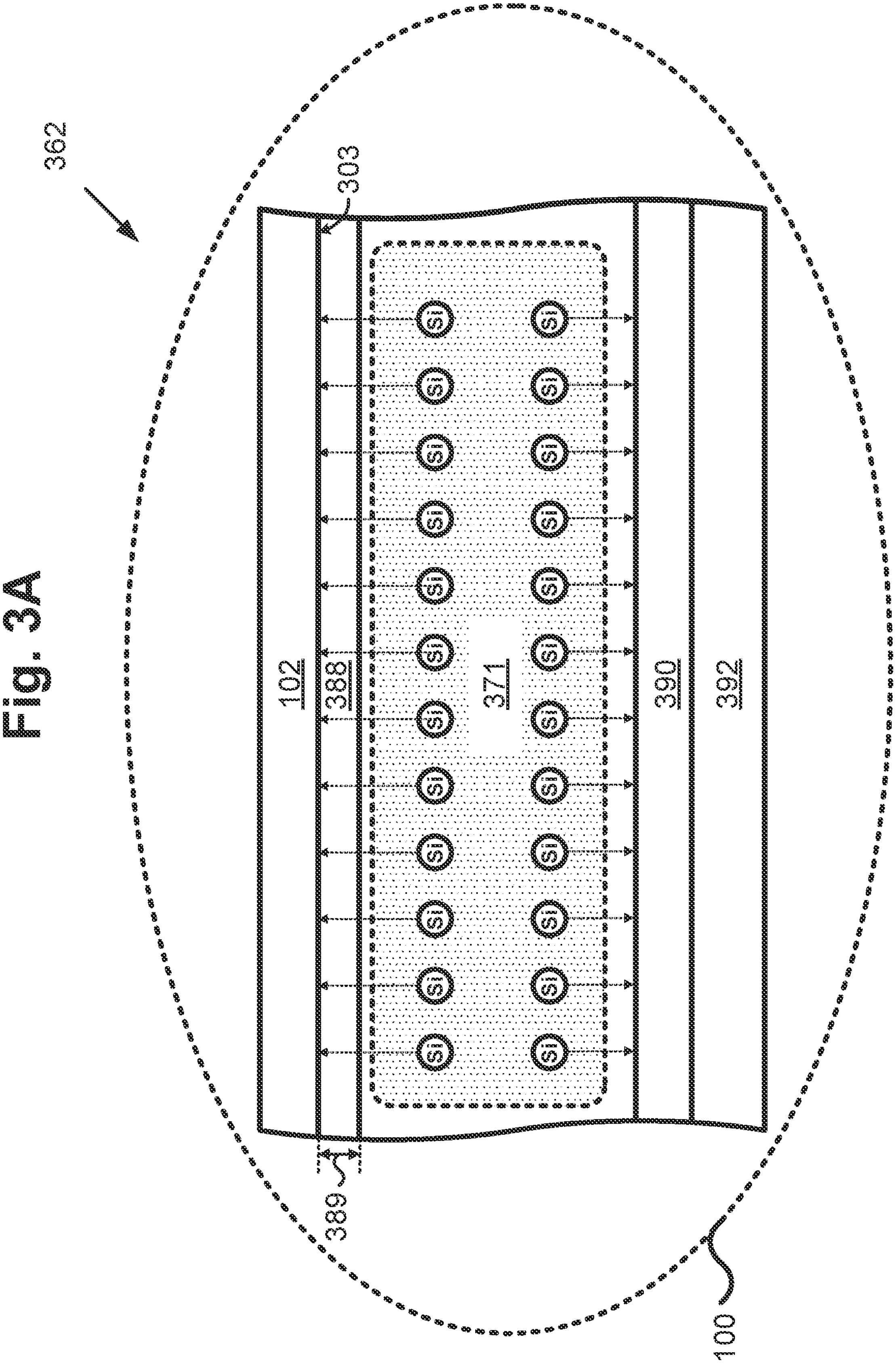
FIG. 3A illustrates a schematic view of a portion of a process chamber processed in accordance with the flowchart of FIG. 2 according to one embodiment of the disclosure.
Figure 3B:
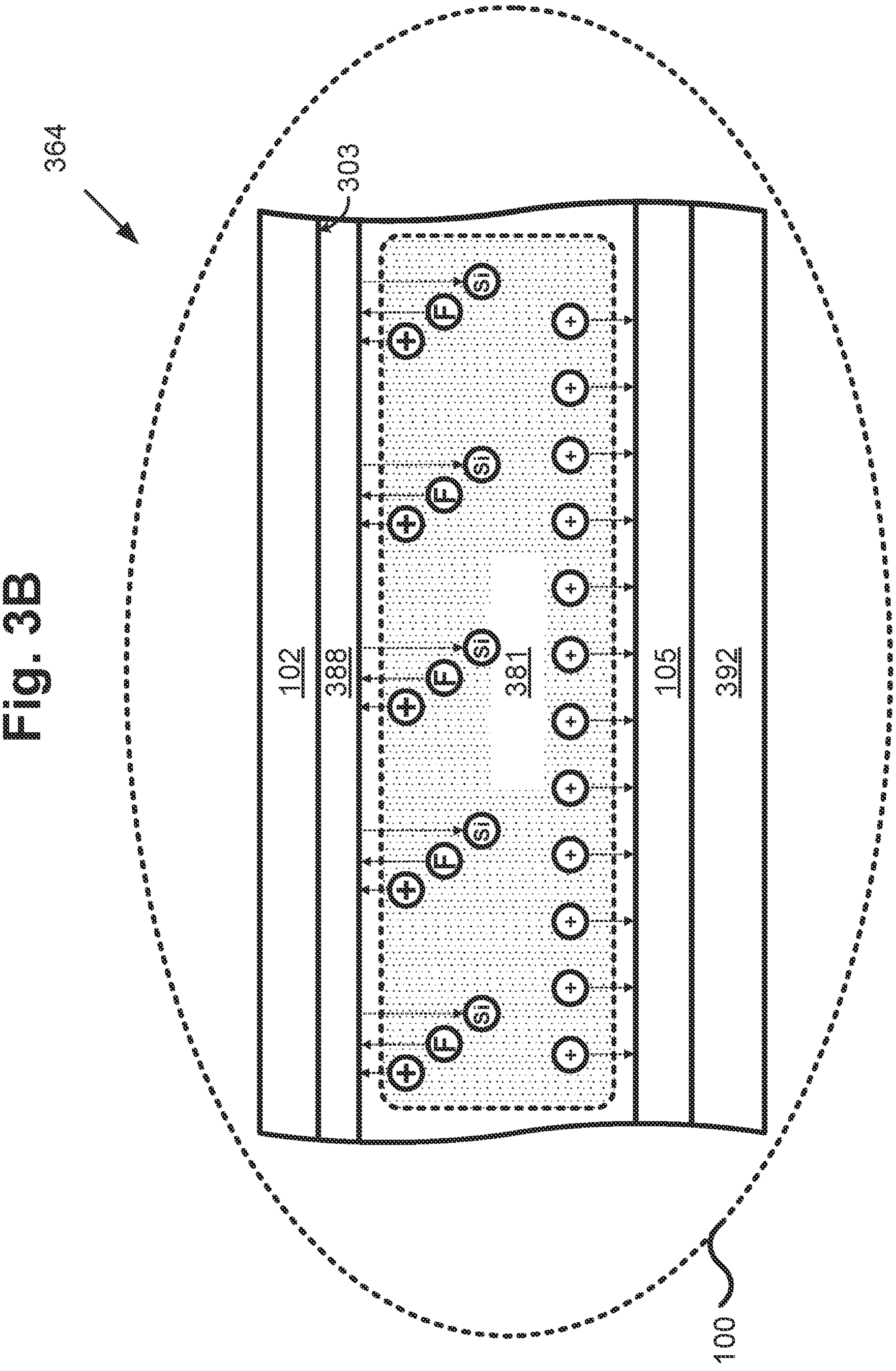
FIG. 3B illustrates a schematic view of a portion of the process chamber processed in accordance with the flowchart of FIG. 2 according to one embodiment of the disclosure.
Figure 3C:
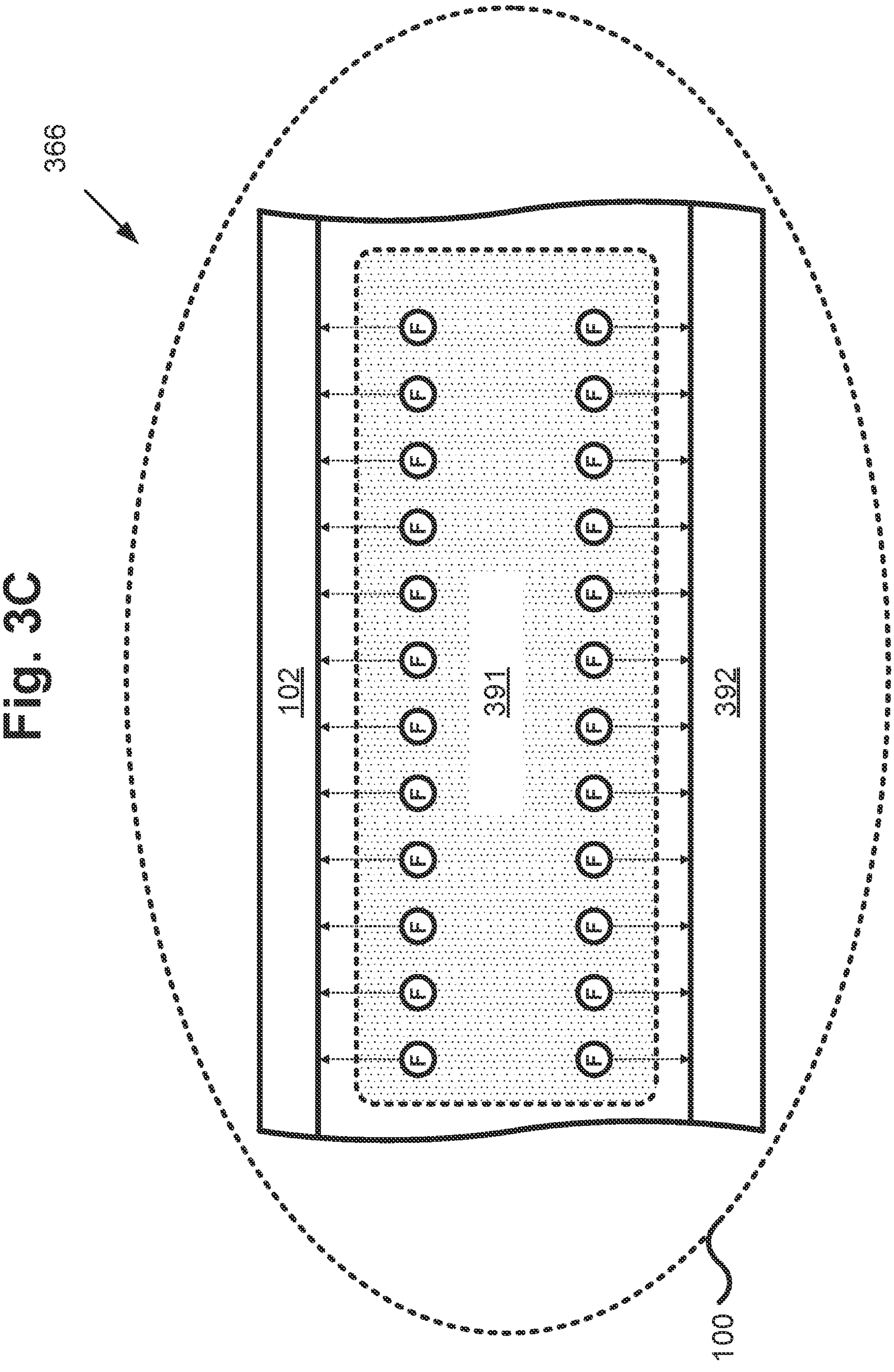
FIG. 3C illustrates a schematic view of a portion of the process chamber processed in accordance with the flowchart of FIG. 2 according to one embodiment of the disclosure.

FIG. 2 illustrates a flowchart of a method 200 for processing a substrate according to one embodiment of the disclosure. FIGS. 3A, 3B, and 3C illustrate schematic views of a process chamber as results of performing operations 262, 264, and 266, respectively, shown in the flowchart of FIG. 2, according to examples of the disclosure. For example, FIG. 3A shows a schematic view of a portion of a process chamber after performing the operation 262 in FIG. 2, FIG. 3B shows a schematic view of a portion of the process chamber after performing the operation 264 in FIG. 2, and so forth.

The method 200 begins at operation 262 by forming, in-situ a process chamber, a coating layer on a surface of a lid assembly of the process chamber, the coating layer comprising a silicon-containing material, the lid assembly comprising an oxygen-containing material.

With reference to FIG. 3A, the structure 362 illustrates a portion of the process chamber 100 after performing the coating operation 262 in FIG. 2 according to an embodiment of the disclosure.

As illustrated in FIG. 3A, the process chamber 100 includes the lid assembly 102 and an electrostatic chuck 392. The electrostatic chuck 392 may be a part of a substrate support assembly (e.g., the substrate support assembly 104 shown in FIG. 1A) of the process chamber 100.

As illustrated in FIG. 3A, a coating layer 388 is formed on an interior surface 303 of the lid assembly 102. It is noted that the coating layer 388 is formed in-situ the process chamber 100 after the lid assembly 102 is placed on the chamber body (e.g., the chamber body 101 shown in FIG. 1A) to form an enclosed inner volume. The coating layer 388 can also be removed in-situ the process chamber 100 after etching a target layer of a substrate.

In one embodiment, the lid assembly 102 includes an oxide-based material. In an example, the lid assembly 102 may include aluminum oxide (e.g., $Al_2O_3$), yttrium oxide (e.g., $Y_2O_3$), or other suitable materials that may function within the processing environment.

As illustrated in FIG. 3A, a silicon-containing gas 371 is flown into the process chamber 100. For example, the silicon-containing gas 371 may be supplied from a gas panel (e.g., the gas panel 132 shown in FIG. 1A) through entry ports (e.g., the entry ports 134 in shown FIG. 1A) into the inner volume of the process chamber 100. In some embodiments, the silicon-containing gas 371 may include one or more of silicon chloride, silicon fluoride, silicon nitride, silicon silane, silicon carbide, or any other suitable silicon-containing material that may function within the processing environment to suppress the release of oxygen from the lid assembly 102. As a result of introducing the silicon-containing gas 371 in the process chamber 100, the coating layer 388 is formed (e.g., deposited) on the interior surface 303 of the lid assembly 102. It should be understood that the coating layer 388 may be also formed on other interior surfaces (e.g., sidewalls) of the process chamber 100.

As illustrated in FIG. 3A, the coating layer 388 formed on the interior surface 303 of the lid assembly 102 has a substantially uniform thickness 389. Generally, the thickness 389 of the coating layer 388 may depend on an application. In one example, the thickness 389 of the coating layer may be in a range of about 100 nanometers (e.g., 100×10^−9 meters) to about 1 micron (e.g., 1×10^−6 meter). In other examples, the thickness 389 may be less than about 100 nanometers or greater than about 1 micron depending on the specific applications.

As illustrated in FIG. 3A, a dummy wafer 390 may be placed on a top surface of the electrostatic chuck 392 prior to forming the coating layer 388 on the lid assembly 102. The dummy wafer covers the electrostatic chuck 392 and prevents the coating layer 388 from being formed (e.g., deposited) on the electrostatic chuck 392. After the coating layer 388 is formed on the lid assembly 102, the dummy wafer 390 is removed before a substrate is transferred into the process chamber 100 and placed on the electrostatic chuck 392 for processing. In another embodiment, in conjunction with or instead of using the dummy wafer 390 to cover the electrostatic chuck 392, the electrostatic chuck 392 may be heated during the formation of the coating layer 388 to prevent particles in the silicon-containing gas 371 from being formed on the electrostatic chuck 392. In yet another embodiment, the coating layer 388 is formed in the same process chamber 100 as which a substrate to be etched is located (i.e., the coating layer 388 is formed in-situ with the production substrate).

Referring back to FIG. 2, the operation 264 includes etching a portion of a target layer disposed on a substrate through one or more openings in a mask layer, while the substrate is disposed on an electrostatic chuck below the coating layer of the lid assembly.

With reference to FIG. 3B, the structure 364 illustrates a portion of the process chamber 100 after performing the operation 264 in FIG. 2 according to an embodiment of the disclosure.

As illustrated in FIG. 3B, the substrate 105 (e.g., a production substrate) is transferred into the process chamber 100 and disposed on the electrostatic chuck 392 for processing. In one embodiment, the substrate 105 may substantially correspond to the substrate 105 shown in FIGS. 1A and 1B, or other similarly configured substrate having a patterned mask overlying a silicon containing target layer to be etched through openings in the mask. The substrate 105 includes a target layer (e.g., the target layer 184 shown in FIG. 1B) and a mask layer (e.g., the mask layer 186 shown in FIG. 1B) over the target layer. In at least some embodiments, a photoresist layer is deposited and patterned on the mask layer.

As illustrated in FIG. 3B, a process gas 381 is supplied from the gas panel (e.g., the gas panel 132 in FIG. 1A) through the entry ports (e.g., the entry ports 134 in FIG. 1A) into the inner volume of the process chamber 100. The process gas 381 is ignited into a plasma in the process chamber 100 by applying power from an RF power supply (e.g., the RF power supply 121 shown in FIG. 1A) to one or more coils (e.g., the first and second coils 118, 120 shown in FIG. 1A). In some examples, power from the RF power source, such as an RF or a pulsed DC source, may also be provided through a matching network (e.g., the matching network 112 shown in FIG. 1A) to electrodes (e.g., the electrodes 109 shown in FIG. 1A) within the substrate support assembly (e.g., the substrate support assembly 104 shown in FIG. 1A). The pressure within the interior of the process chamber 100 may be controlled using a trottle valve (e.g., the trottle valve 136 shown in FIG. 1A) and a vacuum pump (e.g., the vacuum pump 138 shown in FIG. 1A). The temperature of the chamber body may be controlled using fluid-containing conduits (not explicitly shown) that run through the chamber body.

In one embodiment, the process gas 381 may include a fluorine-containing material, such as $C_xH_zF_y$, where x, y can be any integer excluding zero, and z can be any integer including zero (e.g., $CF_4$, $C_2F_6$, $C_3F_8$, $C_4F_8$, $CHF_3$, $CH_2F_2$, $CH_3F$, $NF_3$ and $SF_6$). In another embodiment, the process gas 381 may include a chlorine-containing gas (e.g., $Cl_2$, HCl and $BCl_3$). In another embodiment, the process gas 381 may include an inert gas or another gas including, but not limited to He, Ne, Kr, Xe, Ar and $N_2$. Argon may aid fluorine in etching the target layer 184 particularly when the target layer is a hard dielectric material, such as silicon oxide.

During a plasma assisted etching process, such as an RIE plasma process, the target layer is etched through the patterned mask layer using the plasma-excited process gas 381. In another embodiment, the target layer is selectively etched in the process chamber 100 using one of the plasma etching techniques known to one of ordinary skill in the art of electronic device manufacturing.

In one embodiment, the coating layer 388 suppresses the release of oxygen from the lid assembly 102 during the plasma assisted etching process. As the plasma in the process chamber 100 is not changed by oxygen that would otherwise be released by the lid assembly 102 had the coating layer 388 not been formed on the lid assembly 102, the etch rates of the photoresist and carbon-based mask layer(s) can be reduced.

In one embodiment, the coating layer 388 releases silicon into the process gas 381 during etching. As such, the process chamber 100 becomes a silicon-loaded ICP process chamber. The silicon released by the coating layer 388 creates a sink for the fluorine in the process gas 381. For example, the atomic fluorine may be diverted to consume the silicon released by the coating layer 388 rather than etching the carbon in the mask layer, thereby desirably reducing the etch rate of the carbon-based mask layer.

In some embodiments, while the coating layer 388 is formed on the lid assembly 102, the operation 264 may optionally be repeated to etch one or more additional production substrates in a batch of production substrates in the process chamber 100, before the method 200 proceeds to the operation 266 to remove the coating layer 388 from the lid assembly 102.

Referring back to FIG. 2, the operation 266 includes removing the coating layer from the lid assembly of the process chamber.

With reference to FIG. 3C, the structure 366 illustrates a portion of the process chamber 100 after performing the operation 266 in FIG. 2 according to an embodiment of the disclosure.

As illustrated in FIG. 3C, after the etching of the target layer is performed, the substrate 105 is removed from the process chamber 100. Subsequently, a cleaning process is performed, for example, to remove the coating layer 388 from the lid assembly 102 with no production substrates in the process chamber 100. In one embodiment, the coating layer 388 is etched and removed by energizing a fluorine-containing gas 391 into the plasma state. A suitable composition of the fluorine-containing gas 391 includes fluorocarbon, hydrofluorocarbon, or any combination thereof. For example, the fluorine-containing gas 391 may include $CH_xF_{4-x}$ (e.g., $CF_4$, $CHF_3$, $CH_2F_2$ or $CH_3F$), $C_2H_xF_{6-x}$ (e.g., $C_2F_6$ or $C_2H_2F_4$), $C_2H_xF_{4-x}$ (e.g., $C_2F_4$), $C_3F_6$, $C_3F_8$, $C_4F_6$, $C_4F_8$, $C_5F_8$, $NF_3$, $SF_6$, CFO, or any combination thereof. The fluorine in the fluorine-containing gas 391 can advantageously increase the efficiency of removal of the silicon-based coating layer 388 from the lid assembly 102.

In one embodiment, the fluorine-containing gas 391 may be used to provide a desired high etch rate and stable plasma for removing the coating layer 388 from the lid assembly 102. In one embodiment, the removal of the coating layer 388 is performed during an internal chamber cleaning process where an internal chamber cleaning recipe is used to remove the coating layer 388 as well as cleaning the entire interior region of the process chamber 100.

In some embodiments, several production substrates in a batch of production substrates can be processed (e.g., etched) in the process chamber 100 before the cleaning process according to the operation 266 is performed. In some embodiments, the cleaning process according to the operation 266 is performed after each production substrate in a batch of production substrates is processed.

After removing the coating layer for the lid assembly of the process chamber (e.g., after the operation 266 in FIG. 2), the process chamber 100 substantially returns to the initial state it was in before the coating layer 388 was formed on the lid assembly 102. As illustrated in FIG. 2, after the operation 266, the method 200 may return to the operation 262, where a new silicon-containing coating layer is formed on the interior surface of the lid assembly.

Figures 4A, 4B, 4C:
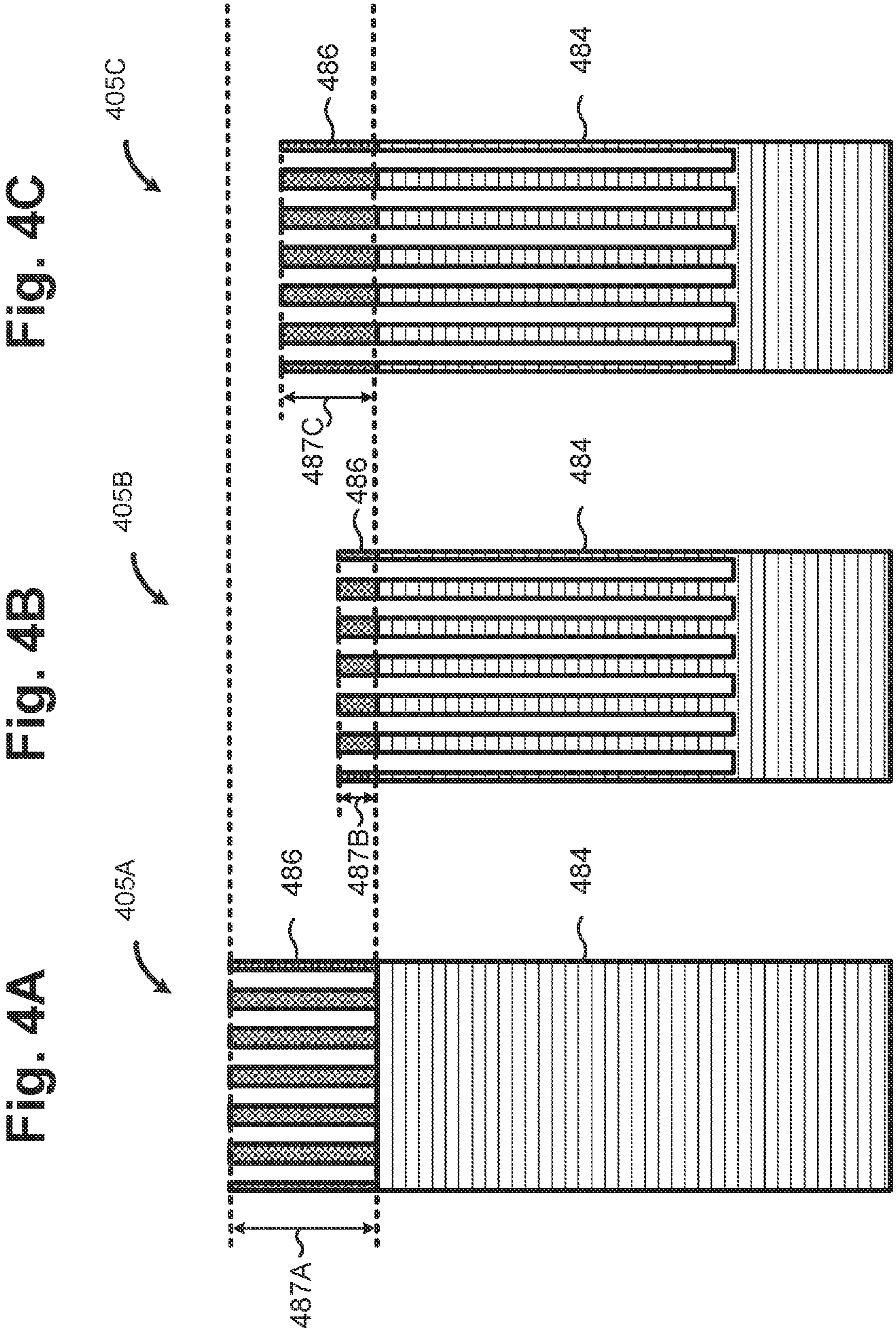
FIG. 4A illustrates a cross-sectional view of a substrate to be processed in an ICP process chamber according to one embodiment of the disclosure.
FIG. 4B illustrates a cross-sectional view of a substrate processed in an ICP process chamber without applying a silicon-containing coating layer on a lid assembly.
FIG. 4C illustrates a cross-sectional view of a substrate processed in an ICP process chamber having a silicon-containing coating layer on a lid assembly according to one embodiment of the disclosure.

FIG. 4A illustrates a schematic cross-sectional view of a substrate 405A to be processed in an ICP process chamber according to an embodiment of the disclosure. The substrate 405A includes a patterned carbon-based mask layer 486 disposed over a target layer 484. The carbon-based mask layer 486 has an initial thickness 487A.

FIG. 4B illustrates a schematic cross-sectional view of a substrate 405B after the substrate 405A in FIG. 4A is processed in an oxide-loaded ICP process chamber without applying a silicon-containing coating layer on a lid assembly. FIG. 4C illustrates a schematic cross-sectional view of a substrate 405C after the substrate 405A in FIG. 4A is processed in a silicon-loaded ICP process chamber having a silicon-containing coating layer formed on a lid assembly according to an embodiment of the disclosure. A high aspect ratio etch is performed on each of the substrates shown in FIGS. 4B and 4C in an ICP etching chamber using the same process recipe.

As illustrated in FIG. 4B, in the substrate 405B, trenches (or openings) are etched in the target layer 484, while the patterned carbon-based mask layer 486 is disposed over the target layer 484. In the example shown in FIG. 4B, absent of a silicon-containing coating layer on a lid assembly, the lid assembly releases oxygen into the plasma during etching and increases the carbon etch rate of the carbon-based mask layer 486 on the substrate 405B. After the substrate 405B is etched, the carbon-based mask layer 486 has a remaining thickness of 487B.

As shown in FIG. 4C, in the substrate 405C, trenches (or openings) are etched in the target layer 484, while the patterned carbon-based mask layer 486 is disposed over the target layer 484. In the example shown in FIG. 4C, with a silicon-containing coating layer formed on the lid assembly, the silicon-containing coating layer suppresses the release of oxygen from the lid assembly into the plasma, thereby reducing the carbon etch rate of the carbon-based mask layer 486 on the substrate 405C. In addition, the silicon-containing coating layer releases silicon into the plasma during etching to form a silicon-loaded ICP process chamber. When a fluorine-containing etching chemistry (e.g., HF or $NF_3$ or $SF_6$ or $CF_4$) is used to form the plasma, the silicon released from the coating layer creates a sink for the atomic fluorine in the plasma, which further reduces the carbon etch rate due to the reduced plasma density.

With the formation of the silicon-containing coating layer on the lid assembly of the ICP process chamber, the carbon-based mask etch rate on the substrate 405C is reduced by about 46% as compared to the carbon-based mask etch rate on the substrate 405B. In other examples, the carbon-based mask etch rate on the substrate 405C is reduced by more than 50% as compared to the carbon-based mask etch rate on the substrate 405B. As illustrated in FIG. 4C, after the substrate 405C is etched, the carbon-based mask layer 486 has a remaining thickness of 487C that is significantly greater than the remaining thickness 487B of the carbon-based mask layer 486 shown in FIG. 4B. Thus, high etching selectivity is achieved with the application of the silicon-containing coating layer on the lid assembly of the ICP process chamber. As illustrated in FIG. 4C, the dielectric etch in the target layer 484 results in trenches with a high aspect ratio, while the carbon-based mask layer 486 is well preserved due to the better controlled etch rate of the carbon-based mask layer 486.

Examples disclosed herein generally relate to methods for reducing photoresist and carbon etch rates in an ICP chamber using a silicon-based chamber pre-coat. Among other advantages, coating the lid assembly of the ICP chamber with a silicon-containing material suppresses the release of oxygen and creates a sink for fluorine during a plasma assisted etching process. While the foregoing is directed to specific examples, other examples may be devised without departing from the basic scope thereof, and the scope thereof is determined by the claims that follow.

What is claimed is:

1. A method for etching a target layer disposed on a substrate through a mask layer having a carbon-containing material, the method comprising:

forming, in-situ a process chamber, a coating layer on a surface of a lid assembly of the process chamber, the coating layer comprising a silicon-containing material, wherein the coating layer and the mask layer are compositionally distinct; and etching the target layer while the substrate is disposed on an electrostatic chuck below the coating layer of the lid assembly.

2. The method of claim 1, wherein the forming the coating layer comprises applying a silicon-containing gas to the process chamber, the silicon-containing gas selected from at least one member of the group consisting of silicon chloride, silicon fluoride, silicon nitride, silicon silane, and silicon carbide.

3. The method of claim 1, further comprising placing a dummy wafer on a top surface of the electrostatic chuck prior to forming the coating layer.

4. The method of claim 1, wherein the coating layer has a thickness in a range of about 100 nanometers to about 1 micrometer.

5. The method of claim 1, wherein the lid assembly comprises an oxygen-containing material.

6. The method of claim 1, wherein the target layer comprises a dielectric material.

7. The method of claim 1, further comprising removing the coating layer from the lid assembly of the process chamber after etching the target layer.

8. The method of claim 7, wherein the removing the coating layer comprises using a fluorine-containing gas chemistry to etch the process chamber.

9. The method of claim 7, further comprising:

reapplying a new coating layer on the lid assembly.

10. The method of claim 1, wherein the target layer is etched by a plasma-excited process gas generated by an inductively coupled plasma (ICP) source.

11. A method for processing a substrate, the method comprising:

forming, in-situ a plasma process chamber, a coating layer on a surface of a lid assembly of the plasma process chamber, the coating layer comprising a silicon-containing material;

transferring the substrate into the plasma process chamber, the substrate comprising a target layer and a mask layer over the target layer, the mask layer comprising a carbon-containing material, wherein the coating layer and the mask layer are compositionally distinct; and etching the target layer below the coated lid assembly preferentially relative to the mask layer by using a plasma-excited process gas.

12. The method of claim 11, wherein the forming the coating layer comprises applying a silicon-containing gas to the plasma process chamber, the silicon-containing gas selected from at least one member of the group consisting of silicon chloride, silicon fluoride, silicon nitride, silicon silane, and silicon carbide.

13. The method of claim 11, further comprising:

placing a dummy wafer on a top surface of an electrostatic chuck disposed in the plasma process chamber while forming the coating layer.

14. The method of claim 11, wherein the coating layer is configured to suppress a release of oxygen from the lid assembly into the plasma-excited process gas.

15. The method of claim 11, wherein:

the plasma-excited process gas comprises fluorine; and the coating layer is configured to release silicon into the plasma-excited process gas to create a sink for the fluorine.

16. The method of claim 11, wherein the coating layer has a thickness in a range of about 100 nanometers to about 1 micrometer.

17. The method of claim 11, further comprising removing the coating layer from the lid assembly of the process chamber after etching the target layer.

18. The method of claim 17, wherein the removing the coating layer comprises using a fluorine-containing gas chemistry to etch the plasma process chamber.

19. The method of claim 11, wherein the plasma-excited process gas is generated by an inductively coupled plasma (ICP) source.

* * * * *